United States Patent [19]

Hieber

[11] Patent Number: 4,810,335

[45] Date of Patent: Mar. 7, 1989

[54] METHOD FOR MONITORING ETCHING PROCESSES

[75] Inventor: Konrad Hieber, Bernau, Fed. Rep. of Germany

[73] Assignee: Siemens Aktiengesellschaft, Berlin and Munich, Fed. Rep. of Germany

[21] Appl. No.: 142,201

[22] Filed: Jan. 11, 1988

[30] Foreign Application Priority Data

Jan. 20, 1987 [DE] Fed. Rep. of Germany ....... 3701472

[51] Int. Cl.$^4$ .............................................. C23F 4/00
[52] U.S. Cl. ............................ 204/192.33; 156/627; 204/298
[58] Field of Search ............. 204/192.13, 192.33, 204/298, 298 ET; 156/627, 626; 324/65 R

[56] References Cited

U.S. PATENT DOCUMENTS 4,358,338 11/1982 Downey et al. ............... 156/627
4,543,576 9/1985 Hieber et al. ............... 340/870.17
4,562,089 12/1985 Hieber et al. ............... 427/10

FOREIGN PATENT DOCUMENTS 0067432 12/1982 European Pat. Off. .
0146720 7/1985 European Pat. Off. .
55-62169 5/1980 Japan ............... 156/627
57-13745 1/1982 Japan ............... 156/626
60-106976 6/1985 Japan ............... 156/627

OTHER PUBLICATIONS

E. Bretscher et al, *IBM Tech. Disc. Bull.*, vol. 24, pp. 3653–3654 (1981).
Chapter entitled "Dry Etching" of textbook by C. Sze titled VLSI Technology, pp. 304–307, 334 (1984).
Article by R. M. Clements, "Plasma Diagnostics with Electric Probes", Journal of Vacuum Science Tech., vol. 15, No. 2, Mar./Apr. 1978, pp. 193–198.
Co-pending U.S. application Ser. No. 113,829., filed on Oct. 29, 1987, entitled "Method for Controlling and Supervising Etching Processes".

*Primary Examiner*—Aaron Weisstuch

[57] ABSTRACT

The method for monitoring an end point of an etching process of electrically insulating layers effected by ions, radicals and/or neutral particles in a plasma is accomplished with the assistance of a reference substrate having a defined specimen geometry which is situated on a mobile substrate holder with the layers to be etched. The electrical resistance is measured and a voltage drop of a known constant current is impressed at known time intervals onto an electrically conductive layer lying under the layer to be etched. Measurement of the voltage drop is continued until an injection current is additionally injected into the conductive layer by the plasma to change the voltage drop. Test data is transmitted in non-contacting fashion by pulse code modulated electromagnetic radiation using a telemetry system so that the movable substrate is an independent unit. A process control computer controls the etching process via the etching rate by local monitoring of the end point of the etching carried out in the plasma.

11 Claims, 1 Drawing Sheet

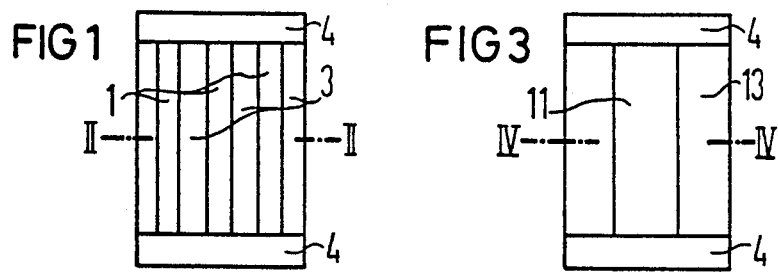
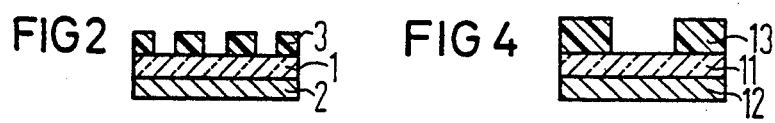
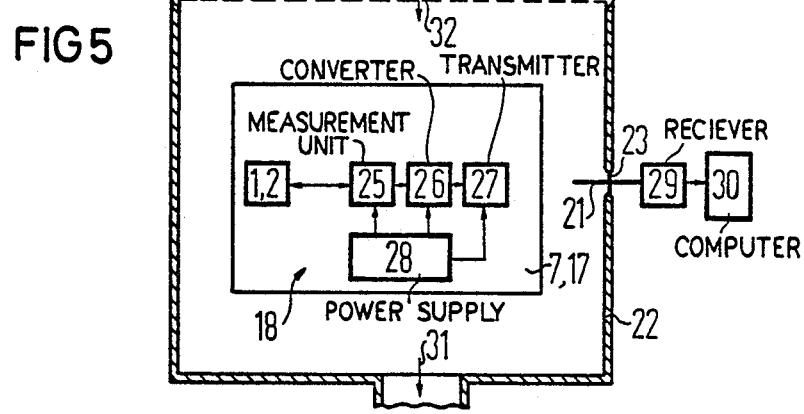
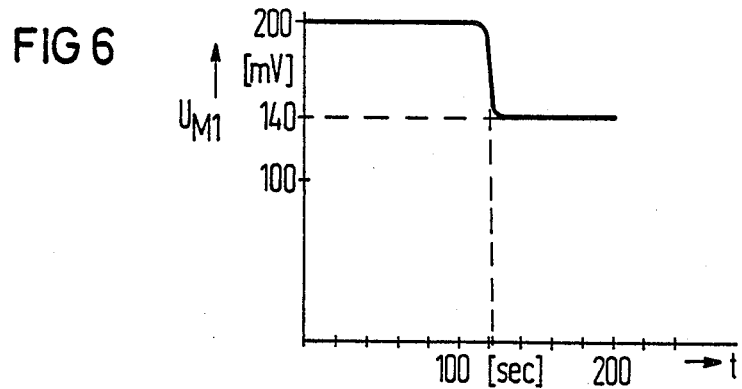

METHOD FOR MONITORING ETCHING PROCESSES

BACKGROUND OF THE INVENTION

1. Field of the Invention

The present invention relates generally to a method for monitoring etching processes effected by ions, radicals and/or neutral particles activated in a plasma, and more particularly to a method for identifying an end point of material erosion of a layer to be etched during material etching in a plasma.

2. Description of the Related Art

The designational, or predeterminable, and dimensionally true structuring of thin, insulating layers by etching processes effected by ions, radicals and/or neutral particles activated in a plasma is a critical process step in the manufacturing of VLSI semiconductor components, as may be derived from the book "VLSI-Technology" by S. M. Sze, McGraw Hill, International Book Company (1984) in the chapter "Dry Etching", and particularly at pages 305, 306 and 307. This process is also known as dry etching.

In what is referred to as the dry etching method, a structured layer of photoresist has previously been situated on a layer to be shaped or on the substrate to be shaped. The problem then is to transfer the structure of the photoresist dimensionally accurately onto the layer of the insulating material or substrate lying therebelow. To accomplish this, the substrate coated in predetermined locations with the photoresist is bombarded with suitable ions, or is introduced into a plasma. Particles such as ions and neutrals chemically activated in the plasma react with the exposed layer or substrate material upon formation of a volatile compound. This reaction causes localized material erosion to occur. The localized material erosion can also be promoted by simple impact processes using atoms, ions, or molecules, also known as atomizing or sputtering.

Care must be exercised during the development of etching processes to ensure that the reactivity of the plasma, as determined by a suitable selection of the initial gases, is such that the erosion rate of the photoresist or of the material lying under the layer to be etched is as low as possible. This means that a separate etching process must be developed for each layer material. Furthermore, since extremely high reproduceability is demanded to the slightest dimensional tolerances, for example ±0.1 μm, the processes must be constantly monitored. In particular, the end point of the etching for each layer must be precisely identified.

Spectrometric methods for characterizing the plasma have been mainly used up to now for identifying the etching end point (see S. M. Sze, VLSI Technology, McGraw Hill, International book Company (1984) page 334). To do so it is essential to find an emission line or absorption line of a molecule in the plasma that is characteristic for the respective etching process. The intensity of this line decreases rapidly when the material to be etched has been completely eliminated. For a known layer thickness, the etching rate is calculated from the time period running from the start of the etching up to the intensity decrease of the spectrometric emission or absorption line. Using this method, it is obvious that averaging occurs over the etching behavior of all wafers being etched in the system. Samples must be taken for local identification of the etching rate by, for example, identifying the extent of material erosion using a scanning electron microscope. This interrupts the etching process, however, and can even render the tested samples useless. Local characterization of the plasma is extremely difficult since the plasma itself is to greatly influenced by the required probes, for example, Langmuir probes. For further details, see the article by Clements in *Journal of Vacuum Science Technology*, 15 (2) March/April 1978, pages 193–198.

European Patent Application 0 146 720 discloses a measurement of a layer but for a layer format of a metallic layer.

SUMMARY OF THE INVENTION

An object of the present invention is to provide a monitoring method for identifying an end point of etching in an etching process such as occurs in a plasma for structuring electrically insulating layers for VLSI circuits, for example.

The present invention embarks on a different way of identifying the end point in dry etching processes of electrically insulating layers. The invention is characterized by a method of etching in which the end point of the material erosion is identified with the assistance of a reference substrate having a defined specimen geometry with low impedance contacts. The end point is identified by measuring the sheet resistivity $R_{M1}$ of a metallically conductive film below the insulating film to be etched so that a voltage dro $U_{M1}$ of a known constant $I_{M1}$ applied to a metallically conductive layer at defined time intervals is measured, and the measurement is continued until an additionally injected current $I_{inj}$ is injected into the metallically conductive layer by the ions and electrons of the plasma to thereby modify the voltage drop $U_{M1}$. Since the etching process preferably occurs in an evacuated space with an evacuable lock chamber used as an etching reactor and with a moveable substrate holder for carrying the substrates to be etched the measured data is transmitted in a non-contacting fashion by electromagnetic radiation using a pulse code modulation method. A telemetric measuring system is mounted on the moveable substrate holder as an independent unit.

The invention makes use of the perception that no electrical charges are injected into the metallically conductive layer from the plasma so long as a cohesive, dense electrically insulating layer is still situated over the metallically conductive layer. This is true since the penetration depth of the ions or electrons is about 1 monolayer, or coat, of the layer material. This means that the sheet resistivity $R_{M1}$ determined by the quotient of the measured voltage drop $U_{M1}$ and the constant current $I_{M1}$ impressed at short time intervals of, for example, 0.1 seconds, corresponds to the true sheet resistivity $R_W$. When the electrically insulating layer to be etched is eroded away, then the electrically charged particles from the etching plasma immediately impress an injection current $I_{inj}$ onto the metallically conductive layer. This superimposes the injection current $I_{inj}$ on the test current $I_{M1}$ and falsifies the measured voltage drop $U_{M1}$. The true sheet resistivity $R_W$ is then calculated according to the equation $R_W = U_{M1}/(I_{M1} + I_{inj}) \neq R_{M1}$.

This assumes that the test current $I_{M1}$ is constant, which means that a sudden change in resistance unambiguously indicates complete removal of the electrically insulating layer to be etched.

The dependency of the end point of the material erosion on the size of the regions to be shaped can be monitored, for example, by providing photoresist mask regions of different sizes on the reference substrate and subsequently dry etching and electrically measuring these different size masked regions.

Identification of the local etching rate of dielectric layers also lies within the framework of the present invention. The respective thicknesses of the layer of the referenced substrate must have been previously identified in such applications.

BRIEF DESCRIPTION OF THE DRAWINGS

FIG. 1 is a plan view of a reference substrate including test contacts provided for measurement according to the principles of the present invention and including a finely structured photoresist layer on an electrically insulating layer;

FIG. 2 is a cross section along line II—II of FIG. 1 showing the finely structured photoresist layer on the reference substrate;

FIG. 3 is a plan view of a reference substrate including test contacts for providing a measurement according to the principles of the present invention and including a coarsely structured photoresist layer on an electrically insulating layer;

FIG. 4 is a cross section along line IV—IV of FIG. 3 showing the coarsely structured photoresist layer on the reference substrate;

FIG. 5 is a functional block diagram of a measuring system according to the principles of the present invention and its arrangement in and relative to an etching system; and FIG. 6 is a graph of voltage over time showing a voltage drop occuring at a defined time to indicate an end point of etching of a dielectric layer.

DESCRIPTION OF THE PREFERRED EMBODIMENTS

In FIG. 1, a reference substrate wafer includes a layer 1 of, for example, $SiO_2$ to be etched and structured. The layer 1 to be etched is applied as can be seen in FIG. 2 to a metallically conductive layer 2 of, for example, doped silicon, metal silicide or an aluminum alloy, in a way entirely analogous to providing semiconductor crystal wafers for the manufacture of integrated circuits. The reference substrate wafer is provided with a photoresist masking 3 defining structures to be etched. The entire reference substrate wafer, or a subregion thereof, is integrated into a telemetry system and is electrically contacted at contact electrodes 4. The contact electrodes 4 are low impedance electrodes applied for the present measurement.

To identify a potential dependency of the etching rate on the size of the regions to be structured, photoresist structures of different sizes are produced on the reference substrate and are subsequently etched and electrically measured. Thus, in FIGS. 3 and 4, a more coarsely structured photoresist layer 13 is applied to a layer 11 of, for example, $SiO_2$ to be eroded which is in turn lying over a metallically conductive layer 12. Low impedance contact electrodes 4 are applied in this embodiment, as well. When the sum of the width of the narrow exposed $SiO_2$ layer portions 1 in FIGS. 1 and 2 is equal to the sum of the width of the broad $SiO_2$ layer portions 11 in FIGS. 3 and 4, then a direct conclusion regarding a difference in the etching rate can be drawn for different chronological curves of the measured resistance of the electrically conductive layer 2 or 12, respectively.

Ih FIG. 5 is shown an arrangement from European Pat. No. 0 067 432, and corresponding U.S. Pat. No. 4,543,576 issued Sept. 24, 1987 which is incorporated by reference herein. In FIG. 5, a measurement system 18 includes a transmitter 27 integrated into a double palette 7 and 17 which represents an independent system. The palette 7 and 17 rotates, and the transmission of measured data from the rotating palette 7 and 17 ensues through a telemetry system. In the telemetry system, a converter 26 converts a test voltage which is measured in the layers 1 and 2 into pulse code modulation signals capable of transmission. The converter 26 is generally situated under the palette 7 and 17 and is thereby protected from bombardment by particles. The measuring apparatus 18 includes a transmitter 27 which is operated by a battery power supply 28.

When radio frequency techniques are used for the transmission of the measured data, a reception antenna 21 is applied extending into a chamber 22 and is conducted out of the chamber 22 through an insulated vacuum bushing 23. A receiver unit 29 for editing the received telemetry data is situated outside of the chamber 22. The measured data can be either in the form of digital or analog signals for interpretation. When the measured data in digital form, it is directly acceptable by a computer 30, as a digital computer, which undertakes immediate evaluation thereof and stops the etching process at the desired point in time.

Thus, in FIG. 5, the layer 1 to be eroded on a metallically conductive substrate 2 is connected to a resistance measurement unit or voltage measurement unit 25, the output of which is fed to the pulse code modulator or convertor 26 and then to the transmitter 27, all of which is powered by the power supply 28.

A simple arrow 31 in FIG. 5 identifies the vacuum connection of the chamber 22, while a double arrow 32 indicates an attached lock chamber.

In FIG. 6, the voltage vs. time graph shows a voltage drop in $U_{M1}$ which occurs at a time of approximately 120 seconds into the etching period of the layer. The voltage drop $U_{M1}$ indicates the end point of the etching of the dielectric layer and is a result of the injection current $I_{inj}$ generated by the etching plasma and reaching the metallically conductive layer. In the illustrated example, the voltage drop $U_{M1}$ is from 200 mV to 140 mV, or a magnitude of negative 60 mV.

In a metrological example, the conductive layer is composed of doped polycrystalline silicon having a specific resistance rho=800 $\mu$Ohm-cm and having a layer thickness of d=0.4 $\mu$m. The sheet resistivity $R_{M1}$=rho/d=20 Ohms square=$R_W$ is calculated. The test current $R_{M1}$ amounts to 10 mA, and the voltage $U_{M1}$=200 mV.

In the exemplary embodiment, the insulating layer is composed of a 0.8 $\mu$m—thick silicon oxide layer. The etching rate of a single wafer system amounts to 0.4 $\mu$m per minute from $R_W=U_{M1}/(I_{M1}+I_{inj})$, calculating at $I_{inj}=U_{M1}/R_W-I_{M1}$, then $I_{inj}=-3$ mA.

A constant known test current $I_{M1}$ is applied to the metallically conductive layer at defined points in time for measurement. The measurement is carried out at these time intervals of, for example, between 0.01 through 1 second. In a preferred embodiment the time interval is 0.2 seconds.

In the present method, a local monitoring of the end point of the etching process can be carried out in a plasma and the dry etching process can, thus, be controlled by the etching rate with the assistance of the process control computer 30. Due to measurements directly carried out in the layer to be eroded, difficult investigations hitherto undertaken in the plasma are now eliminated. The present method is used in the manufacture of structures in dielectric layers in the submicrometer range.

Although other modifications and changes may be suggested by those skilled in the art, it is the intention of the inventor to embody within the patent warranted hereon all changes and modifications as reasonably and properly come within the scope of his contribution to the art.

I claim:

1. A method for monitoring etching processes effected by ions, radicals and/or neutral particles activated in a plasma, comprising the steps of:
   identifying an end point of material erosion of a layer to be etched by using a reference substrate including an electrically insulating layer applied to a metallically conductive layer, said reference substrate including a photoresist mask and a low impedance contact on said electrically insulating layer, said step of identifying including:
   (a) measuring sheet resistivity of said reference substrate to define a specimen geometry,
   (b) applying a constant known test current to said metallically conductive layer at defined points in time,
   (c) measuring a voltage drop until an additional current injected into said metallically conductive layer by ions and electrons in the plasma changes the voltage drop.

2. A method as claimed in claim 1, wherein step (c) is carried out at a time interval of every 0.01 through 1 second.

3. A method as claimed in claim 2, wherein said time interval is approximately 0.2 seconds.

4. A method as claimed in claim 1, further comprising the step of:
   transmitting data obtained during step (c) in non-contacting fashion by pulse code modulated electromagnetic radiation.

5. A method as claimed in claim 1, further comprising the step of:
   calculating a local etching rate dependent on time from data obtained during step (c).

6. A method as claimed in claim 1, further comprising the step of:
   acquiring data obtained during step (c) using a process control computer.

7. A method as claimed in claim 1, further comprising the steps of:
   using an evacuatable lock chamber as an etching reactor; and
   moving a substrate holder carrying said reference substrate and said layer of be etched during material erosion in the plasma.

8. A method for identifying an end point of etching by electrically charged particles activated in a plasma, comprising the steps of:
   etching a layer of electrically insulating material that lies over a layer of electrically conductive material;
   applying a known test current through said layer of electrically conductive material; and
   detecting a change in current flow in said layer of electrically conductive layer as the result of an additional injection current of said electrically charged particles, said change being indicative of an end point of said etching of said layer of electrically insulating material from said layer of conductive material.

9. A method as claimed in claim 8, wherein said change in current is detected by identifying a drop in voltage across said layer of electrically conductive material.

10. A method as claimed in claim 8, wherein said test current is applied periodically at distinct time intervals.

11. A method for identifying complete removal of at least regions of a non-conductive layer lying over a conductive layer, comprising the steps of:
    etching said non-conductive layer in a plasma of electrically charged particles;
    conducting a current of a predetermined amplitude through said conductive layer;
    establishing a voltage across said conductive layer as the result of said current of predetermined amplitude, and
    detecting a change in said established voltage caused by injection of said electrically charged particles into said conductive layer, said change in voltage being indicative of removal of said non-conducting layer from said conductive layer.

* * * * *